United States Patent
Thörner et al.

(10) Patent No.: US 10,083,787 B1
(45) Date of Patent: Sep. 25, 2018

(54) CURRENT CONVERTER WITH INTERCHANGEABLE HEAD

(71) Applicant: PHOENIX CONTACT GMBH & CO. KG, Blomberg (DE)

(72) Inventors: Carsten Thörner, Melle (DE);
Andreas Senger, Altenbeken (DE);
Jürgen Hobein, Hameln (DE); Markus Becker, Paderborn (DE)

(73) Assignee: Phoenix Contact GMBH & Co. KG, Blomberg (DE)

( * ) Notice: Subject to any disclaimer, the term of this patent is extended or adjusted under 35 U.S.C. 154(b) by 0 days.

(21) Appl. No.: 15/960,398

(22) Filed: Apr. 23, 2018

Related U.S. Application Data

(63) Continuation of application No. 14/428,964, filed as application No. PCT/EP2013/067382 on Aug. 21, 2013, now Pat. No. 9,978,495.

(30) Foreign Application Priority Data

Sep. 17, 2012 (DE) .......................... 10 2012 018 412

(51) Int. Cl.
*H01F 38/20* (2006.01)
*H01F 27/02* (2006.01)
(Continued)

(52) U.S. Cl.
CPC ............... *H01F 27/04* (2013.01); *H01F 5/04* (2013.01); *H01F 27/02* (2013.01); *H01F 27/29* (2013.01);
(Continued)

(58) Field of Classification Search
CPC ........ H01F 38/12; H01F 27/022; H01F 27/02; H01F 38/30
(Continued)

(56) References Cited

U.S. PATENT DOCUMENTS 3,208,021 A * 9/1965 Elliott ..................... H01F 27/40
200/302.1
3,690,313 A * 9/1972 Weppner ............ A61B 5/04282
128/902
(Continued)

FOREIGN PATENT DOCUMENTS

DE          201 10 845 U1     8/2002
DE     10 2010 060 387 A1     5/2012
(Continued)

OTHER PUBLICATIONS

International Preliminary Report of Patentability dated Nov. 21, 2013, including International Search Report Written Opinion of the International Searching Authority, as well as English language translations thereof, in corresponding PCT Application No. PCT/EP2013/067382, 19 pgs total.
(Continued)

*Primary Examiner* — Tsz Chan
(74) *Attorney, Agent, or Firm* — Knobbe, Martens, Olson & Bear LLP

(57) ABSTRACT

The subject matter herein pertains to a current transformer, comprising a secondary coil, connection contacts for establishing electrically conductive contact with the secondary coil from the outside, and a housing having a housing body and a housing head, wherein the secondary coil is accommodated in the housing body and/or is attached to the housing body, and the connection contacts of the secondary coil are provided on the housing head. According to one implementation, a connecting mechanism is provided, by means of which the housing head and the connection contacts can be mechanically or electrically conductively detachably connected to the housing body and to the secondary coil. A current transformer is therefore provided,
(Continued)

Figure 1:
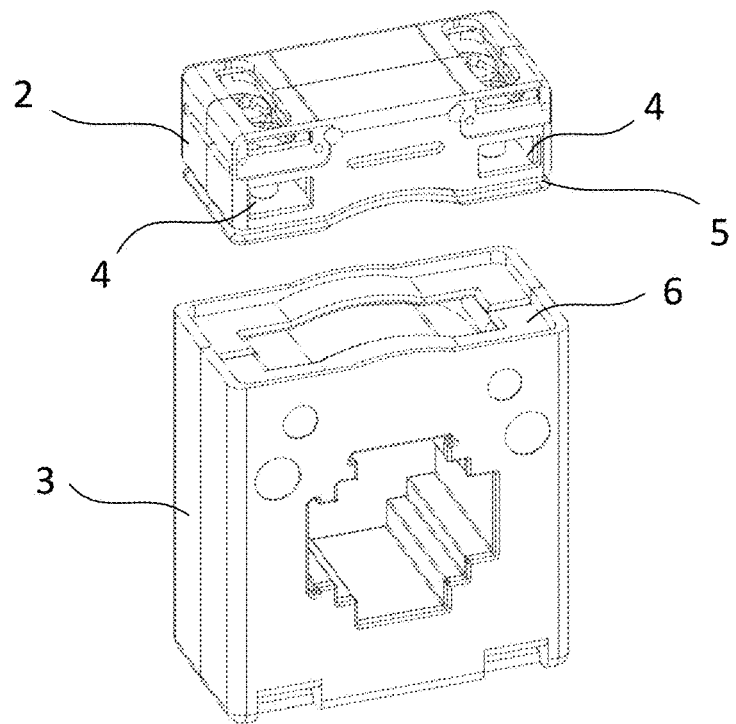

which is cost-effective to produce and is flexible in terms of the use thereof.

20 Claims, 5 Drawing Sheets

(51) Int. Cl.
    *H01F 17/06*     (2006.01)
    *H01F 27/04*     (2006.01)
    *H01F 27/29*     (2006.01)
    *H01F 38/28*     (2006.01)
    *H01F 27/40*     (2006.01)
    *H01F 27/30*     (2006.01)
    *H01F 5/04*     (2006.01)
    *H01F 27/06*     (2006.01)

(52) U.S. Cl.
    CPC ......... *H01F 27/306* (2013.01); *H01F 27/402* (2013.01); *H01F 38/28* (2013.01); *H01F 27/06* (2013.01)

(58) Field of Classification Search
    USPC ................................ 336/90, 92, 96, 98, 173
    See application file for complete search history.

(56) References Cited

U.S. PATENT DOCUMENTS

| 5,363,079 | A | * | 11/1994 | Zawada | ................ | B29C 65/58 |
|---|---|---|---|---|---|---|
| | | | | | | 336/175 |
| 6,081,078 | A | * | 6/2000 | Truskalo | ................ | H04N 3/22 |
| | | | | | | 315/371 |
| 6,081,313 | A | | 6/2000 | Kim | | |
| 2009/0115403 | A1 | * | 5/2009 | Bernklau | ............ | G01R 15/186 |
| | | | | | | 324/127 |
| 2009/0186504 | A1 | * | 7/2009 | Santos | ................ | H01F 27/04 |
| | | | | | | 439/188 |

FOREIGN PATENT DOCUMENTS

| GB | 519402 A | 3/1940 |
|---|---|---|
| JP | 60189210 A | 9/1985 |
| JP | H07283053 A | 10/1995 |
| WO | WO 1992/17044 A1 | 10/1992 |
| WO | WO 2011/083030 A1 | 7/2011 |
| WO | WO 2012/090539 A1 | 7/2012 |

OTHER PUBLICATIONS

Office Action received in German counterpart application No. 10 2012 018 412.3, dated Jul. 3, 2013; 8 pages.

* cited by examiner

CURRENT CONVERTER WITH INTERCHANGEABLE HEAD

CROSS-REFERENCE TO RELATED APPLICATION INFORMATION

This is a continuation of application Ser. No. 14/428,964, filed Mar. 17, 2015, published as US/20150279542A1, which is a U.S. 371 National Stage Application of International Application No. PCT/EP2013/067382 filed Aug. 21, 2013, published as WO2014/040830 A1, which claims priority from German Patent Application No. 10 2012 018412.3, filed Sep. 17, 2012, published as DE 10 2012018412, which are incorporated herein by reference in entirety.

The invention relates to a current transformer, comprising a secondary coil, connection contacts for establishing electrically conductive contact with the secondary coil from the outside, and a housing having a housing body (3) and a housing head, wherein the secondary coil is accommodated in the housing body and/or is attached to the housing body, and the connection contacts of the secondary coil are provided on the housing head.

Current transformers are usually used to measure alternating currents and function according to the transformer principle. A transformer has a magnetic circuit—usually a ferrite or iron core, around which the conductors of two different electric circuits are wound. When an alternating voltage is applied to one of the windings, a magnetic field builds up. When an alternating magnetic field passes through a coil, an electric voltage is induced, the level of which relative to the originally applied voltage corresponds to the ratio of the numbers of turns of the corresponding windings.

As compared to the secondary coil, the primary coil often has very few turns or only one turn, which consists in the primary conductor being routed through the secondary coil. This is called a slip-over or straight-through transformer. The level of the current induced in the secondary winding depends on the number of secondary turns and is substantially proportional to the inducing primary current. It is therefore very well suited for use as a measured or manipulated variable.

In contrast to the Rogowski coil, a current transformer comprises a usually toroidal, ferromagnetic core, which, due to the bundling of the magnetic field, ensures high efficiency and high accuracy in respect of the proportionality between the primary and secondary currents.

Due to the high efficiency, secondary currents are generated by a current transformer that are high enough that these secondary currents are suitable for use, directly and without further amplification, for the control or regulation of further switching components.

This has the disadvantage, however, that a secondary circuit of a current transformer must never be operated when open, since the very high ("infinite") resistance between the open secondary clamps results in very high voltages between said secondary clamps. This would not only pose a danger to persons, but would also result in voltage overloads and breakdowns, which can destroy the current transformer.

An advantage of current transformers is the electrical insulation of the primary and secondary currents. The secondary circuit is therefore independent of the potential of the primary circuit. Modifications of the secondary circuit that are basically potential-free are therefore possible without the need to switch off a primary circuit that has potential.

The motivation therefore exists, with respect to power supply devices, for example, to be able to modify a circuit arrangement of the secondary circuit in a current transformer that is operating on the primary side without the current transformer being destroyed by an interruption of the secondary circuit that occurred in the meantime.

This goal can be achieved by temporarily short-circuiting the secondary circuit of the current transformer before disconnecting the connecting leads.

To this end, current transformers having appropriate short-circuit devices for the manual or automatic bridging of the connection contacts are known.

In other application scenarios, in which the primary current can be easily switched off, a current transformer having an integrated short-circuit device is suboptimal, however, since this is too complex.

Rather, other application scenarios can be characterized in that different installation conditions have different connection requirements.

The problem is therefore that of providing a current transformer, which can be cost-effectively provided regardless of the application scenario.

The problem is solved according to the invention by the features of the subject matter of claim 1. Advantageous embodiments of the invention are defined in the dependent claims.

According to the invention, a current transformer is therefore provided, said current transformer comprising a secondary coil, connection contacts for establishing electrically conductive contact with the secondary coil from the outside, and a housing having a housing body and a housing head, wherein the secondary coil is accommodated in the housing body and/or is attached to the housing body, and the connection contacts of the secondary coil are provided on the housing head, characterized in that a connecting mechanism is provided, by means of which the housing head and the connection contacts can be mechanically or electrically conductively detachably connected to the housing body and to the secondary coil.

The current transformer according to the invention offers the advantage that the housing head, which comprises the connection contacts of the current transformer, can be removed and therefore replaced. This results in a number of further advantages.

The secondary coil is an essential component of a current transformer, wherein said secondary coil is usually enclosed by a housing body. In a common embodiment of a current transformer as a straight-through or slip-over transformer, the secondary coil is disposed in a flat housing body, which has, in the center thereof, an opening for the passage of a primary conductor in the sense of the primary coil. The primary conductor, which is routed through the housing body, provides mechanical fixation of the housing body, which cannot be released without the primary conductor being removed.

The current transformer according to the invention can be advantageously designed such that at least one part of the current transformer, namely the housing head having the connection contacts, can be replaced without the need to remove the primary conductor. This reduces the amount of work required for performing maintenance, retrofitting, or modification of an installation.

Another advantage results with regard for the production of the current transformer. The housing body and the housing head can be produced independently of one another and can be joined in a subsequent production stage, upon delivery, or during installation.

In the common embodiments, the secondary coil is accommodated and enclosed by the housing body. Another object of the invention is a partial enclosure of the secondary coil by the housing body or an embodiment of the housing body as a fastening element for the secondary coil.

This is advantageously designed such that the part of the connection mechanism that is used for the mechanical connection is designed as a groove-spring combination, for example in the form of a sliding mechanism. When the dimensions are appropriate, such a mechanical connection provides sufficient loadability with respect to mechanical loads that occur during installation and operation.

In an embodiment of the housing body and the housing head as an injection-molded element, associated grooves or springs can be realized in a cost-effective manner.

Advantageously, the part of the connection mechanism used to electrically connect the connection contacts to the ends of the secondary coil comprises electrically conductive spring contacts.

Since frequent replacement of the housing heads is typically unexpected, the spring contacts can be designed for a low number of contactings and decontactings.

Advantageously, the current transformer also comprises a short-circuiter, by means of which the secondary coil can be short-circuited when the housing head is removed from the housing body. Such a short-circuiter permits the housing head and the housing body to be separated even while current is flowing in the primary coil, without the risk of voltage overloads.

It is advantageous when the connection mechanism is designed such that removing the housing head from the housing body results in an automatic short-circuiting of the short-circuiter such that the risk of operator error can be reduced.

In addition or as an alternative to a short-circuiter in the housing body, the housing head in another advantageous embodiment comprises a short-circuiter. As with the above-described short-circuiter, this can also be designed to be manual or automatic, wherein this short-circuiter is usually actuated when connection leads are contacted to or decontacted from the current transformer.

In another advantageous embodiment, a housing head for a current transformer according to the invention comprises protective electronics and/or functional electronics. This can also comprise electronics for monitoring the secondary circuit. The impedance of the secondary circuit can be monitored, for example, such that a short-circuiter protects the current transformer against overload when a predetermined threshold is exceeded.

Advantageously, the connection contacts of the housing head are designed as push-in contacts or screw-type contacts. These can be realized in a reliable and cost-effective manner. The specific configuration can depend on the intended application, wherein housing heads having different connection contacts can be provided for the same current transformer.

Therefore, it is advantageous to design a set of housing heads for a current transformer according to the invention, wherein the connection mechanism is designed such that the housing body can be alternatively connected to the housing heads in the set.

It is therefore possible to streamline production, since uniform housing bodies can now be designed for different current transformers having different connection techniques, wherein said uniform housing bodies can be combined with the respectively desired housing head in order to form the final product.

Furthermore, retrofits or expansions can be carried out on existing installations such that a current transformer having a housing head without short-circuit protection or without protective electronics can be replaced with a new housing head having a different and, possibly, expanded functionality without considerable effort.

Finally, it is advantageous to standardize the connection mechanism between the housing body and the housing head such that a housing head can be combined with different housing bodies.

Advantageously, a set of housing bodies for a current transformer according to the invention is therefore equipped with a connection mechanism that allows the housing head to be alternatively connected to the housing bodies of the set.

This embodiment also makes it possible to further streamline the production of current transformers, since it is now possible to provide uniform housing heads for current transformers, for example, current transformers having different sizes and performance classes.

For example, the same housing head could be combined with a housing body for low-voltage applications and with a housing body for high-voltage applications. Since the primary conductor and the secondary coil are electrically insulated with respect to one another, the dielectric strength of the current transformer is determined by the dielectric separation of the primary conductor and the secondary coil. Due to suitable dimensioning of the spacings and/or the dielectric dimensioning of the materials (e.g., housing shell, air) between the primary conductor and the secondary coil, the current transformer according to the invention can be operated with voltage differentials between the primary conductor and the secondary coil of over 1000V.

The advantage of being able to use the same housing head in combination with different housing bodies is also useful when the housing body must be partially removed in order to remove the head. The housing body of a current transformer is often formed of two complementary housing shells, namely an upper shell and a lower shell. In an embodiment having a simple design, the housing head, which is considered to be a single part, is installed before the housing shells are joined. The housing head can be fixed by means of a peripheral groove-spring connection, which is closed by joining the housing shells. As a result, the connection between the housing head and the housing body can be loaded in any direction with relative pressure, tensile, or shear forces.

The invention is described in greater detail in the following with reference to the attached drawings and preferred embodiments.

In the drawings

Figure 2A:
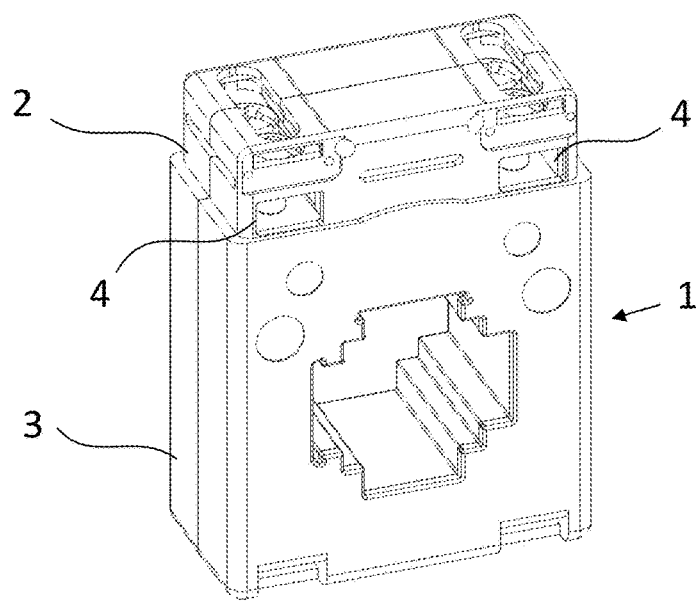
Figure 2B:
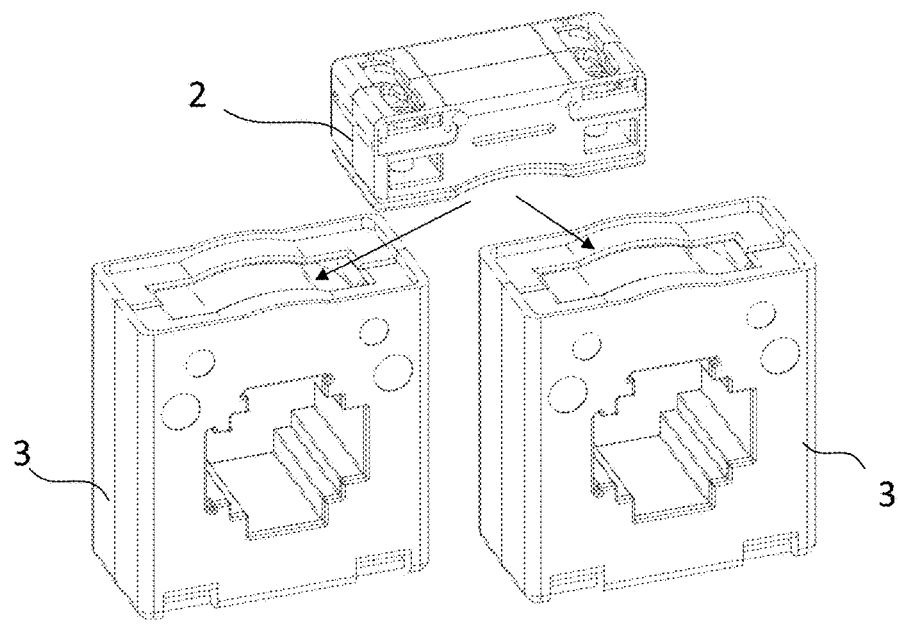
Figure 2C:
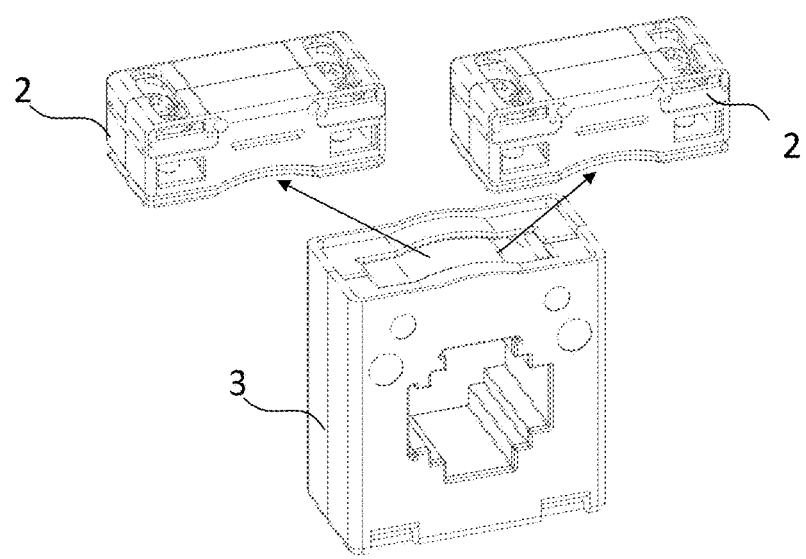

FIG. 1 shows a current transformer according to a preferred embodiment of the invention, separated into the housing body and the housing head, FIGS. 2A-2C show current transformers according to preferred embodiments of the invention showing the housing body and the housing head joined (FIG. 2A), a housing body alternatively connected to plural housing heads (FIG. 2B), and a housing head alternatively connected to plural housing bodies (FIG. 2C).

Figure 3A:
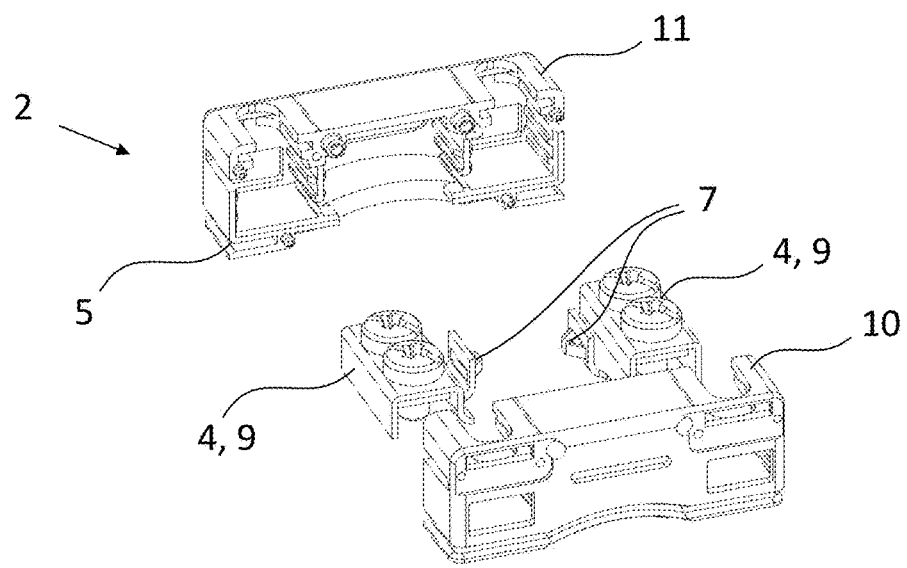
Figure 4A:
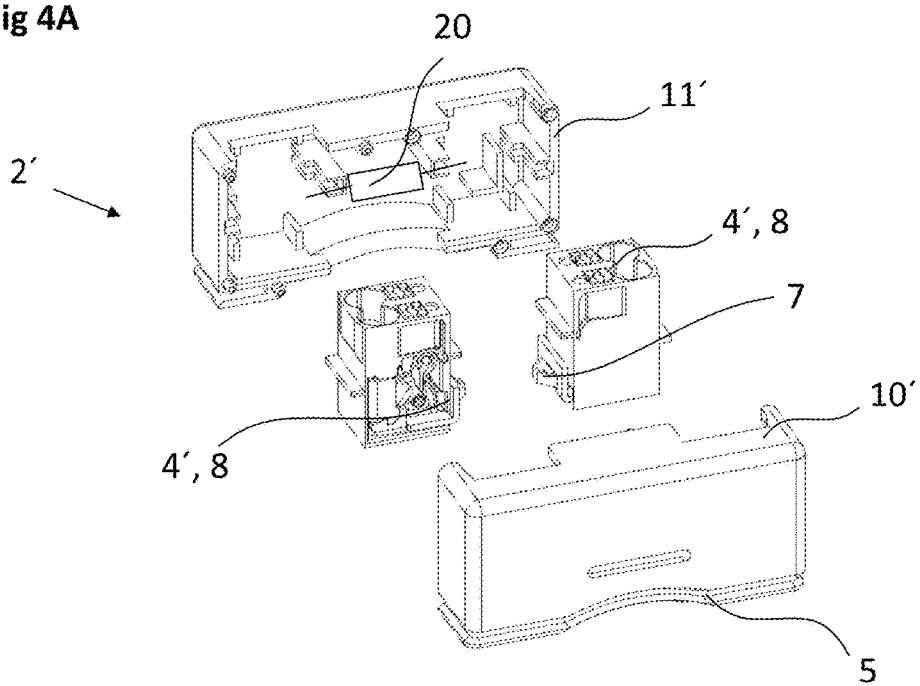
Figure 5:
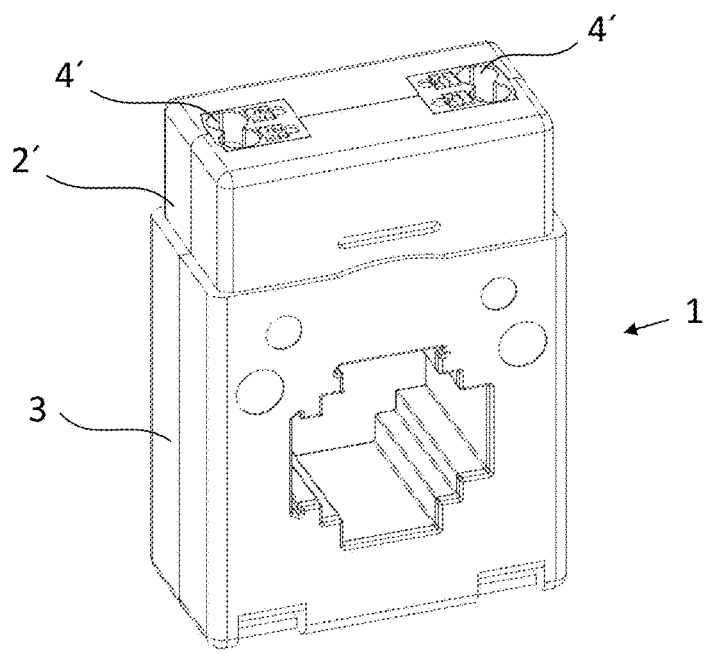
Figure 6:
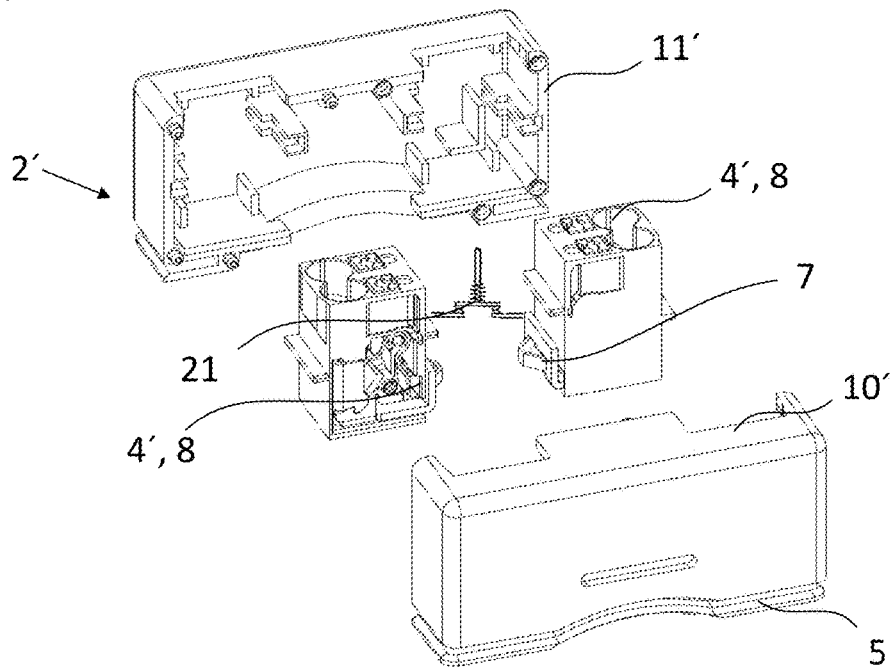

FIG. 3a,b show a housing head of a current transformer according to a preferred embodiment of the invention, FIG. 4a,b show a housing head of a current transformer according to a preferred embodiment of the invention, and FIG. 5-6 show current transformers according to other preferred embodiments of the invention, FIG. 5 comprising a housing body and an alternative embodiment of a housing head, FIG. 6 showing the short-circuiting device.

FIG. 1 shows a first embodiment of a current transformer 1 according to the invention, separated into a housing body 3 and a housing head 2. The depiction is perspective and the housing head 2 is shown raised above the installation site thereof on the housing body 3.

The housing head 2 comprises two connection contacts 4, via which the secondary coil—not visible—can be contacted in the housing body 3 when the housing head 2 is installed. As the mechanical part of a connection mechanism, the housing of the housing head 2 comprises a groove 5, into which a spring 6 of the housing body 3 can engage. In the embodiment shown, the groove 5 encircles the housing head 2 and the spring 6 of the housing body 3 is correspondingly annular such that the installed housing head 2 has no freedom of motion relative to the housing body 3. The peripheral spring 6 prevents horizontal shearing of the housing head 2 relative to the housing body 3, and the engagement of the spring 6 into the groove 5 prevents a change in vertical position. In this embodiment, the housing body 3 formed of two housing shells must be opened in order to install the housing head 2.

FIG. 2A shows the current transformer 1 according to a preferred embodiment of the invention with a first embodiment of a housing head 2. The groove-spring design shown in FIG. 1 undergoes mutual engagement in FIG. 2A and is covered by the upper edge of the housing body 3. The connection mechanism may be designed such that housing bodies and housing heads can be alternatively connected to each other. FIG. 2B shows a connection mechanism designed such that a housing head can be alternatively connected to plural housing bodies of a set of housing bodies. FIG. 2C shows a connection mechanism designed such that the housing body can be alternatively connected to plural housing heads of a set of housing heads.

FIG. 3a shows a first embodiment of a housing head 2 of a current transformer 1 according to a preferred embodiment of the invention, comprising a front housing head shell 10, a rear housing head shell 11, and the connection contacts 4. The connection contacts 4 designed as a screw-type contact 9 are fixed by joining the front housing head shell 10 and the rear housing head shell 11 via webs located in the housing head shells 10, 11. Furthermore, the connection contacts 4 comprise a spring contact 7, by means of which a mating contact—which is not shown—in the housing body 3 can be contacted such that these, as the electrical part of the connection mechanism, can enable the electrical connection of the connection contacts 4 to the ends of the secondary coil.

Figure 3B:
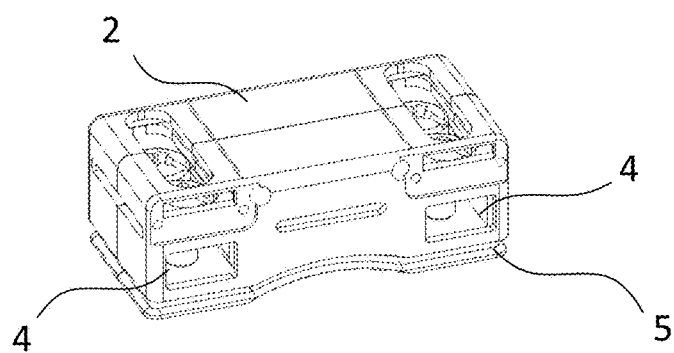

FIG. 3b shows the first embodiment of a housing head 2 depicted in FIG. 3a, in the installed state.

FIG. 4a shows a second embodiment of a housing head 2' of a current transformer 1 according to the invention, which comprises a front housing head shell 10', a rear housing head shell 11', and the connection contacts 4'. The connection contacts 4', which are designed as push-in contacts 8, are fixed by joining the front housing head shell 10' and the rear housing head shell 11' via the webs located in the housing head shells 10', 11'. Furthermore, the connection contacts 4' comprise a spring contact 7, by means of which a mating contact—which is not shown—in the housing body 3 can be contacted such that these, as the electrical part of the connection mechanism, can enable the electrical connection of the connection contacts 4' to the ends of the secondary coil.

Figure 4B:
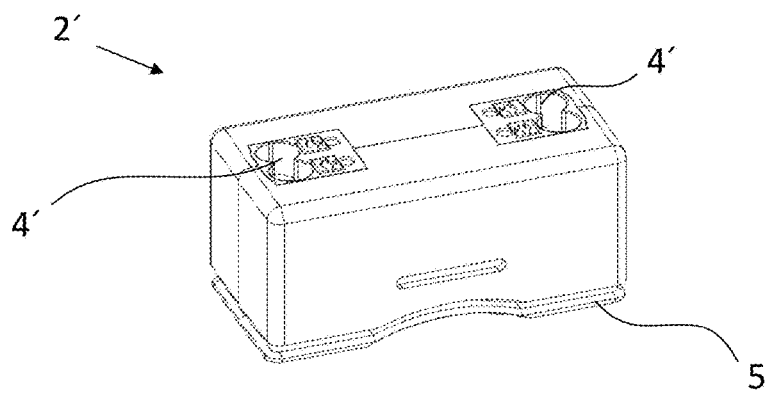

FIG. 4b shows the second embodiment of a housing head 2' depicted in FIG. 4a, in the installed state. A groove 5, as part of the mechanical connection mechanism, can be seen on the lower edge of the housing head 2'.

FIG. 5 shows a current transformer 1 according to a preferred embodiment of the invention having the housing body 3 depicted in FIG. 1 and the second embodiment of a housing head 2', which is depicted in FIG. 4b. The spring 6, which can be seen in FIG. 1, engages into the groove 5, which can be seen in FIG. 4b. The mutually engaged groove-spring design is covered by the upper edge of the housing body 3.

FIG. 6 shows a current transformer 1 according to another embodiment of the invention with the short-circuiting device 21.

LIST OF REFERENCE SIGNS current transformer 1
housing head 2, 2'
housing body 3
connection contact 4, 4'
groove 5
spring 6
spring contact 7
push-in contact 8
screw-type contact 9
front housing head shell 10, 10'
rear housing head shell 11, 11'
protective electronics or functional electronic component 20
short-circuiting device 21

The invention claimed is:

1. A current transformer, comprising
 a secondary coil,
 a housing having a flat housing body and a housing head, the flat housing body having, in the center thereof, an opening for the passage of a primary conductor, wherein the primary conductor, which is routed through the flat housing body, mechanically fixes the housing body in place such that the housing body cannot be released without the primary conductor being removed,
 electrical connection contacts located on the housing head for establishing electrically conductive contact with the secondary coil from the outside, and
 one or more connecting mechanisms, by which the housing head and the electrical connection contacts can be mechanically and electrically conductively detachably connected to the housing body and to the secondary coil,
 wherein the secondary coil is disposed within the flat housing body,
 wherein the connection contacts of the secondary coil are provided on the housing head,
 wherein the current transformer is a straight-through or slip-over transformer, and
 wherein the housing head is removably mounted on top of the housing body such that the housing head including the electrical connect contacts for the secondary coil can be removed and replaced without removing the housing body of the current transformer's housing from the primary conductor.

2. The current transformer of claim 1, wherein the connection mechanism used for the mechanical or electrical conductive detachable connection is designed as a sliding mechanism and has a combination of groove and spring.

3. The current transformer of claim 1, wherein the connection mechanism for the electrical connection comprises electrically conductive spring contacts, via which the connection contacts can be connected to the ends of the secondary coil.

4. The current transformer of claim 1, wherein the current transformer comprises a short-circuiter, via which the secondary coil is short-circuited when the housing head is removed from the housing body.

5. The current transformer according to claim 4, wherein the connection mechanism is designed such that removing the housing head from the housing body results in an automatic short-circuiting of the short-circuiter.

6. The current transformer of claim 1, wherein the connection contacts are designed as push-in contacts or screw-type contacts.

7. The current transformer of claim 1, wherein a primary conductor routed through the housing body to the secondary coil can be operated with voltage differences between the primary conductor and the secondary coil of over 1000V due to geometric dimensioning of the spacings and/or dielectric dimensioning of the materials between the primary conductor and the secondary coil.

8. The current transformer of claim 1, wherein the housing head comprises protective electronics and/or functional electronics.

9. The current transformer of claim 4, wherein the connection mechanism used for the mechanical or electrical conductive detachable connection is designed as a sliding mechanism and has a combination of groove and spring.

10. The current transformer of claim 4, wherein the connection mechanism for the electrical connection comprises electrically conductive spring contacts, via which the connection contacts can be connected to the ends of the secondary coil.

11. A current transformer, comprising
a secondary coil,
a housing having a flat housing body and a housing head, the flat housing body having, in the center thereof, an opening for the passage of a primary conductor, wherein the primary conductor, which is routed through the flat housing body, mechanically fixes the housing body in place such that the housing body cannot be released without the primary conductor being removed,
electrical connection contacts located on the housing head for establishing electrically conductive contact with the secondary coil from the outside, and
one or more connecting mechanisms, by which the housing head and the electrical connection contacts can be mechanically and electrically conductively detachably connected to the housing body and to the secondary coil,
wherein the secondary coil is disposed within the flat housing body,
wherein the connection contacts of the secondary coil are provided on the housing head,
wherein the current transformer is a straight-through or slip-over transformer,
wherein the housing head is removably mounted on top of the housing body; and
wherein the connection mechanism used for the mechanical connection is designed as a sliding mechanism and has a combination of groove and spring.

12. The current transformer of claim 11, wherein the current transformer comprises a short-circuiter, via which the secondary coil is short-circuited when the housing head is removed from the housing body.

13. The current transformer according to claim 12, wherein the connection mechanism is designed such that removing the housing head from the housing body results in an automatic short-circuiting of the short-circuiter.

14. The current transformer of claim 11, wherein the connection contacts are designed as push-in contacts or screw-type contacts.

15. The current transformer of claim 11, wherein a primary conductor routed through the housing body to the secondary coil can be operated with voltage differences between the primary conductor and the secondary coil of over 1000V due to geometric dimensioning of the spacings and/or dielectric dimensioning of the materials between the primary conductor and the secondary coil.

16. The current transformer of claim 11, wherein the housing head comprises protective electronics and/or functional electronics.

17. The current transformer of claim 12, wherein the connection contacts are designed as push-in contacts or screw-type contacts.

18. The current transformer of claim 12, wherein a primary conductor routed through the housing body to the secondary coil can be operated with voltage differences between the primary conductor and the secondary coil of over 1000V due to geometric dimensioning of the spacings and/or dielectric dimensioning of the materials between the primary conductor and the secondary coil.

19. The current transformer of claim 11, wherein the housing head is removably mounted on top of the housing body such that the housing head including the electrical connect contacts for the secondary coil can be removed and replaced without removing the housing body of the current transformer's housing from the primary conductor.

20. The current transformer of claim 11, wherein the connection mechanism for the electrical connection comprises electrically conductive spring contacts, via which the connection contacts can be connected to the ends of the secondary coil.

* * * * *